(12) United States Patent
Qin

(10) Patent No.: US 11,942,608 B2
(45) Date of Patent: Mar. 26, 2024

(54) DEVICE BATTERY AND UNMANNED AERIAL VEHICLE

(71) Applicant: AUTEL ROBOTICS CO., LTD., Guangdong (CN)

(72) Inventor: Wei Qin, Guangdong (CN)

(73) Assignee: AUTEL ROBOTICS CO., LTD., Guangdong (CN)

( * ) Notice: Subject to any disclaimer, the term of this patent is extended or adjusted under 35 U.S.C. 154(b) by 717 days.

(21) Appl. No.: 17/088,884

(22) Filed: Nov. 4, 2020

(65) Prior Publication Data

US 2021/0050630 A1    Feb. 18, 2021

Related U.S. Application Data

(63) Continuation of application No. PCT/CN2018/116712, filed on Nov. 21, 2018.

(30) Foreign Application Priority Data

May 4, 2018    (CN) .......................... 201810421468.6

(51) Int. Cl.
  *H01M 10/42*    (2006.01)
  *B64C 39/00*    (2023.01)
  (Continued)

(52) U.S. Cl.
  CPC ......... *H01M 10/4257* (2013.01); *B64C 39/00* (2013.01); *G01R 31/36* (2013.01);
  (Continued)

(58) Field of Classification Search
  USPC ....................................................... 320/134
  See application file for complete search history.

(56) References Cited

U.S. PATENT DOCUMENTS

2012/0008393 A1    1/2012    Han et al.
2016/0059726 A1*   3/2016    Berman .................... B60L 3/12
                                                      903/907
(Continued)

FOREIGN PATENT DOCUMENTS

CN    201689955 U    12/2010
CN    101989459 A     3/2011
(Continued)

OTHER PUBLICATIONS

The First Chinese Office Action dated Feb. 18, 2023; Appln. No. 201810421468.6 with English Translation.
(Continued)

*Primary Examiner* — Mohammed Alam

(57) ABSTRACT

The present application provides a device battery and an unmanned aerial vehicle (UAV). The device battery includes: a battery microprocessor, an electrically erasable programmable read-only memory and a marking component. The battery microprocessor is connected to the electrically erasable programmable read-only memory, and the marking component is connected to the battery microprocessor and the electrically erasable programmable read-only memory. The marking component is configured to mark a storage address to which battery data is written last time. The battery microprocessor is configured to write battery data to the electrically erasable programmable read-only memory in a cyclic erasing writing mode according to the storage address currently marked by the marking component. According to the solution, an independent electrically erasable programmable read-only memory is added inside the device battery to store the battery data, which can improve stability and safety of battery data storage. In addition, a storage size of the memory can be flexibly selected accord-
(Continued)

ing to actual requirements, to avoid a waste of storage resources and of occupied areas of the memory.

10 Claims, 4 Drawing Sheets

(51) Int. Cl.
    *B64U 50/19*    (2023.01)
    *G01R 31/36*    (2020.01)
    *G11C 16/10*    (2006.01)
    *G11C 16/34*    (2006.01)
    *H01M 10/48*    (2006.01)

(52) U.S. Cl.
    CPC .............. *G11C 16/10* (2013.01); *G11C 16/34* (2013.01); *H01M 10/425* (2013.01); *H01M 10/48* (2013.01); *B64U 50/19* (2023.01); *H01M 2010/4271* (2013.01); *H01M 2220/20* (2013.01)

(56) References Cited

U.S. PATENT DOCUMENTS

| | | | |
|---|---|---|---|
| 2018/0050798 A1* | 2/2018 | Kapuria | B64F 3/02 |
| 2018/0114554 A1* | 4/2018 | Katayama | G11C 7/1096 |
| 2021/0050630 A1* | 2/2021 | Qin | H01M 10/4257 |

FOREIGN PATENT DOCUMENTS

| | | |
|---|---|---|
| CN | 201926746 U | 8/2011 |
| CN | 203365649 U | 12/2013 |
| CN | 106716161 A | 5/2017 |
| CN | 108365283 A | 8/2018 |
| EP | 0398545 A1 | 11/1990 |
| JP | 2008146255 A | 6/2008 |
| WO | WO2006018925 A1 | 2/2006 |

OTHER PUBLICATIONS

International Search Report dated Feb. 26, 2019; PCT/CN2018/116712.

* cited by examiner

DEVICE BATTERY AND UNMANNED AERIAL VEHICLE

This application is a continuation application of International Application No. PCT/CN2018/116712, filed on Nov. 21, 2018, which claims priority of Chinese Patent Application No. 201810421468.6, filed on May 4, 2018, which is incorporated herein by reference in its entirely.

BACKGROUND

Technical Field

The present application relates to the field of batteries, and in particular, to a device battery and an unmanned aerial vehicle.

Related Art

With the continuous development of electronic technologies, the integration of electronic devices becomes increasingly higher, and the volume also becomes increasingly smaller. The electronic device herein includes related products operating based on electric energy. Currently, in order to improve the portability of the electronic device, most electronic devices support installation of a battery and are powered by the battery.

Due to various factors, the battery may malfunction, for example, battery overdischarge, and the like. Therefore, in order to improve battery performance and battery quality, it is necessary to analyze battery failure causes based on battery data.

SUMMARY

The present application provides a device battery and an unmanned aerial vehicle (UAV), which are used to provide accurate and reliable battery data for battery failure analysis.

A first aspect of the present application provides a device battery, including: a battery microprocessor, an electrically erasable programmable read-only memory and a marking component, the battery microprocessor being connected to the electrically erasable programmable read-only memory, and the marking component being connected to the battery microprocessor and the electrically erasable programmable read-only memory. The marking component is configured to mark a storage address to which battery data is written last time, and the battery microprocessor is configured to write battery data to the electrically erasable programmable read-only memory in a cyclic erasing writing mode according to a storage address currently marked by the marking component.

Preferably, the marking component includes: a monitoring unit, the monitoring unit being connected to the battery microprocessor; the monitoring unit being configured to monitor whether a battery data writing event occurs; and the marking component being specifically configured to, when the monitoring unit detects the occurrence of the battery data writing event, clear the currently marked storage address and mark a storage address for writing this time.

Preferably, the battery microprocessor includes: an erasing component and a writing component, the erasing component being connected to the electrically erasable programmable read-only memory, and the writing component being connected to the erasing component and the electrically erasable programmable read-only memory; the erasing component being configured to erase, after the battery microprocessor determines a storage address for writing this time, the battery data stored in the storage address; and the writing component being configured to, after the erasing component finishes erasing, write, to the storage address for writing this time, battery data that needs to be written this time.

Preferably, the battery microprocessor includes: a timing component, the battery microprocessor being further configured to set a period for the timing component; and the timing component being configured to periodically trigger, according to the period, the battery microprocessor to write the battery data to the electrically erasable programmable read-only memory in a cyclic erasing writing mode according to the storage address currently marked by the marking component.

Preferably, the electrically erasable programmable read-only memory includes: a plurality of storage addresses with logical sequence relationships and a plurality of storage units, where each of the storage addresses corresponds to at least one storage unit.

Preferably, the battery microprocessor includes: a first reading component and a first determining component, where the first reading component is connected to the marking component, and the first determining component is connected to the first reading component; the first reading component is configured to read, when battery data needs to be written, the storage address currently marked by the marking component; and the first determining component is configured to determine, as a storage address for writing this time, a storage address next to the storage address read by the first reading component.

Preferably, the plurality of storage addresses are continuous.

Preferably, the marking component includes: a mark storage unit and a first counter, the mark storage unit being connected to the first counter; the mark storage unit being configured to store the storage address to which battery data is written last time; and the first counter being configured to, when a battery data writing event occurs, read and calculate a calculation result obtained by adding 1 to the storage address currently stored in the mark storage unit, and replace the storage address stored in the mark storage unit with the calculation result.

Preferably, the battery microprocessor includes: a second reading component, a second counter and a second determining component, where the second reading component is connected to the marking component, the second counter is connected to the second reading component, and the second determining component is connected to the second counter; the second reading component is configured to read, when battery data needs to be written, the storage address currently marked by the marking component; the second counter is configured to calculate a calculation result obtained by adding 1 to the storage address read by the second reading component; and the second determining component is configured to determine, as a storage address for writing this time, the calculation result calculated by the second counter.

Preferably, the marking component is integrated inside the electrically erasable programmable read-only memory.

A second aspect of the present application provides an unmanned aerial vehicle (UAV), including: any of the device batteries.

In the device battery and the UAV provided in the present application, the device battery includes a battery microprocessor, an electrically erasable programmable read-only memory connected to the battery microprocessor, and a marking component connected to the battery microprocessor and the electrically erasable programmable read-only memory. The marking component marks the storage address to which the battery data is written last time, and the battery microprocessor writes the battery data to the electrically erasable programmable read-only memory in a cyclic erasing mode according to the storage address. The present application provides solutions specifically for battery data scenarios. According to the solutions, an independent electrically erasable programmable read-only memory is added inside the device battery to store the battery data, which can improve the stability and safety of battery data storage. In addition, a storage size of the memory can be flexibly selected according to actual requirements, to avoid a waste of storage resources and occupied areas of the memory.

BRIEF DESCRIPTION OF THE DRAWINGS

The accompanying drawings herein, which are incorporated into the specification and constitute a part of this specification, illustrate embodiments consistent with the present application and, together with the specification, serve to explain the principles of the present application.

REFERENCE NUMERALS

| 1. Battery microprocessor; | 2-Electrically-erasable programmable read-only memory (EEPROM); | 3-Marking component; |
|---|---|---|
| 11-Erasing component; | 12-Writing component; | 13-Timing component; |
| 14-First reading component; | 15-First determining component; | 16-Second reading component; |
| 17-Second counter; | 18-Second determining component; | 31-Monitoring unit; |
| 32-Mark storage unit; | 33-First counter. | |

Explicit embodiments in the present application are shown by using the foregoing accompanying drawings, more detailed descriptions are provided below. The accompanying drawings and literal descriptions are not intended to limit the scope of the idea of the present application in any manner, but explain the concept of the present application by referring to specific embodiments for a person skilled in the art.

DETAILED DESCRIPTION

Exemplary embodiments are described in detail herein, and examples of the exemplary embodiments are shown in the accompanying drawings. When the following descriptions relate to the accompanying drawings, unless otherwise indicated, same numbers in different accompanying drawings represent same or similar elements. The implementations described in the following exemplary embodiments do not represent all implementations that are consistent with the present application. On the contrary, the implementations are merely examples that are described in detail in the appended claims and that are consistent with some aspects of the present application. The implementations in the present application may be implemented alone, or may be implemented jointly in a case without conflict.

Figure 1A:
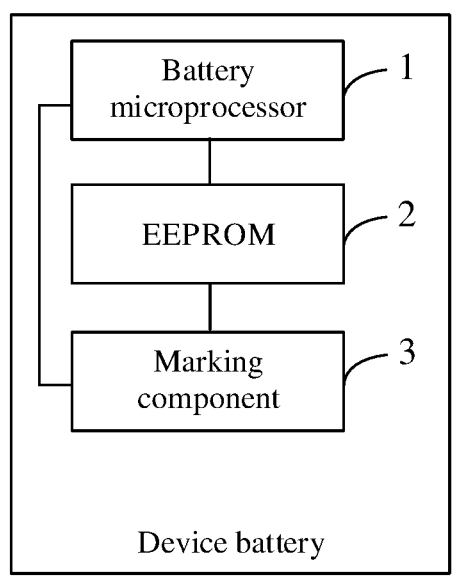
FIG. 1A is a schematic structural diagram of a device battery according to Embodiment 1 of the present application.

FIG. 1A is a schematic structural diagram of a device battery according to Embodiment 1 of the present application. Referring to FIG. 1A, the present embodiment provides a device battery for storing battery data safely and reliably, to facilitate battery failure analysis. The device battery includes:

a battery microprocessor 1, an electrically erasable programmable read-only memory 2, and a marking component 3, the battery microprocessor 1 being connected to the electrically erasable programmable read-only memory 2, and the marking component 3 being connected to the battery microprocessor 1 and the electrically erasable programmable read-only memory 2;

the marking component 3 being configured to mark a storage address to which battery data is written last time; and the battery microprocessor 1 being configured to write the battery data to the electrically erasable programmable read-only memory 2 in a cyclic erasing writing mode according to the storage address currently marked by the marking component 3.

The battery microprocessor 1 and the electrically erasable programmable read-only memory 2 are separately disposed in the device battery. The battery microprocessor 1 may refer to a component with processing capabilities that can complete operations such as a fetching instruction, an executing instruction, exchanging information with an external memory and logic component, and the like. When applied to the device battery, the microprocessor can be used for battery management. The battery microprocessor 1 in the solution is mainly configured to write data to the electrically erasable programmable read-only memory 2 according to the storage address for writing last time and marked by the marking component 3, and the data writing method adopts a cyclic erasing mode.

In practical application, the battery microprocessor 1 may be implemented in a plurality of forms. For example, the battery microprocessor 1 may be an integrated circuit, or may be a chip, for example, a CPU, or the like. Specifically, the battery microprocessor 1 may store related computer programs in advance, and the battery microprocessor 1 executes the computer programs, to write the battery data to the electrically erasable programmable read-only memory 2 in a cyclic erasing mode according to the storage address marked by the marking component 3. In addition, the battery microprocessor 1 may further execute the computer program to read the battery data from the electrically erasable programmable read-only memory 2.

The electrically erasable programmable read-only memory 2 is configured to store battery data, which may be obtained by the battery microprocessor 1. In order to ensure data security, in the solution, the electrically erasable programmable read-only memory (EEPROM for short) is adopted to store the battery data. Even if the battery malfunctions, the data will not be lost without power supply, thereby facilitating battery failure analysis according to the stored battery data.

Optionally, another method is storing the battery data in a flash memory (FLASH) of the battery microprocessor. However, since first of all, since the battery microprocessor is mainly configured to store data such as a main program APP, the space for storing the battery data is limited, and if the battery microprocessor with large storage is used, costs will be greatly increased. In addition, the data will be lost after the flash memory is powered off, and therefore the security of the battery data cannot be effectively ensured. Therefore, compared with the above methods, the device battery provided in the solution can ensure the safe storage of data by disposing an independent EEPROM for storing battery data. Since the independent memory in the device battery according to the solution, a size of the memory may be selected according to the actual use situation, the storage memory may be maximized under ideal costs to increase the flexibility of design. In addition, the independent memory has more stable performance and safer data storage than the flash memory inside the battery microprocessor.

Moreover, in this solution, the battery microprocessor 1 adopts a data writing method of cyclic erasing. In combination with the application scenarios of this solution, the battery data in this solution may be used for battery failure analysis. Generally, the battery data recorded last few times can accurately and truly reflect the cause of the battery failure. Therefore, the solution adopts a cyclic erasing writing method to retain the battery data recorded last few times. The specific retention times may be determined according to actual needs, so that the battery failure analysis can be accurately realized without excessive storage space.

The connection between the marking component 3 and the battery microprocessor 1 and the electrically erasable programmable read-only memory 2 includes, but is not limited to, a connection mode capable of implementing data communication, for example, electric connection, direct connection, indirect connection, and the like. In actual application, the marking component 3 may be disposed independently, or may be integrated inside the electrically erasable programmable read-only memory 2.

Figure 1B:
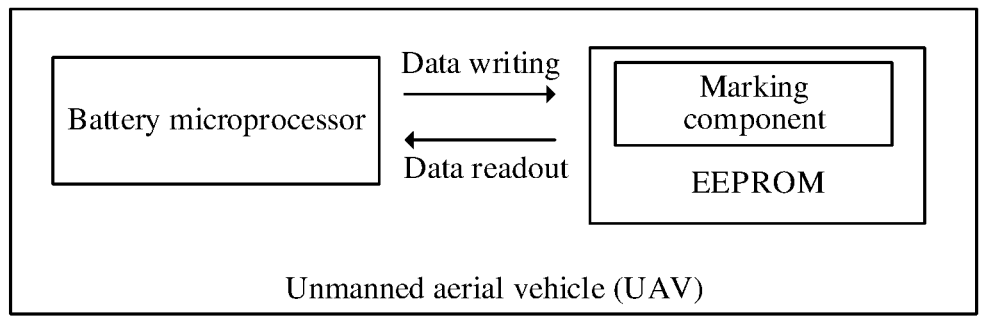
FIG. 1B is an implementation diagram of an architecture according to an embodiment of the present application.

For example, the marking component 3 may be integrated in the EEPROM 2, and the battery microprocessor 1 and the EEPROM 2 may be connected through a communication port. Accordingly, the marking component 3 may communicate with the battery microprocessor 1 through the communication port of the EEPROM 2. An application scenario of an unmanned aerial vehicle (UAV) is used as an example. As shown in FIG. 1B, FIG. 1B is an implementation diagram of an architecture of the present embodiment. As shown in the figure, in this solution, an independent EEPROM is additionally disposed to implement the storage of battery data, and the data writing or reading can be implemented by using a battery microprocessor.

Specifically, when the battery data needs to be written, the battery microprocessor 1 starts writing the battery data into the EEPROM 2 according to a writing rule of cyclic erasure by sending a writing command. When the battery data needs to be read, the battery microprocessor 1 may send a reading command to the EEPROM 2 to read the battery data.

The device battery provided in the present embodiment includes a battery microprocessor, an electrically erasable programmable read-only memory connected to the battery microprocessor, and a marking component connected to the battery microprocessor and the electrically erasable programmable read-only memory. The marking component marks the storage address to which the battery data is written last time, and the battery microprocessor writes the battery data to the electrically erasable programmable read-only memory in a cyclic erasing mode according to the storage address. The present application provides solutions specifically for battery data scenarios. According to the solutions, an independent electrically erasable programmable read-only memory is added inside the device battery to store the battery data, which can improve the stability and safety of battery data storage. In addition, a storage size of the memory can be flexibly selected according to actual requirements, to avoid a waste of storage resources and occupied areas of the memory.

Figure 2:
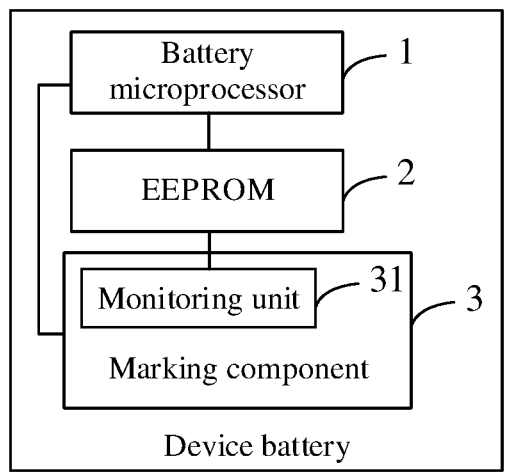
FIG. 2 is a schematic structural diagram of a device battery according to Embodiment 2 of the present application.

Optionally, in order to mark, in time, the storage address to which the battery data is written last time, in one implementation, as shown in FIG. 2, FIG. 2 is a structural schematic diagram of a device battery according to Embodiment 2 of the present application. Referring to FIG. 2, the present embodiment provides a device battery for marking, in time, the storage address for writing last time. Based on any of the other embodiments, the marking component 3 includes: a monitoring unit 31.

The monitoring unit 31 is connected to the battery microprocessor 1.

The monitoring unit 31 is configured to monitor whether a battery data writing event occurs.

The marking component 3 is specifically configured to, when the monitoring unit 31 detects the occurrence of the battery data writing event, clear the currently marked storage address and mark a storage address for writing this time.

The battery data writing event indicates that the battery microprocessor 1 writes battery data to the EEPROM 2. Specifically, when the monitoring unit 31 detects that the battery microprocessor 1 writes the battery data to the EEPROM 2, the marking component 3 needs to update the marked storage address. Specifically, the marking component 3 clears the currently marked storage address, and marks the storage address to which the battery data is to be written this time, so that the storage address marked by the marking component 3 can always be the storage address for writing last time, thereby improving the accuracy and reliability of data storage.

It may be understood that the currently written storage address and/or the currently read storage address in the cyclic erasing mode may both need to be determined based on the storage address for writing last time. For example, it is assumed to see the following table.

| 0x0 | 0x1 | 0x2 | 0x3 | 0x4 | 0x5 | 0x6 | 0x7 | |
|-----|-----|-----|-----|-----|-----|-----|-----|---|
| 1   | 0   | 1   | 0   | 0   | 0   | 0   | 0   |   |

Currently, there are 8 storage addresses 0x0-0x7. When data is written for the first time, the battery microprocessor 1 first uses 0x0 as a storage address to be used for writing, finally uses an address bit 0x7 as a storage address, and then erases the content of 0x0 after cyclic writing and write new data, and so on. Each time the battery data is written, the storage address for writing this time is marked, to accurately mark the storage address for writing last time.

In the device battery provided in the present embodiment, the marking component includes a monitoring unit configured to monitor a battery data writing event. When the monitoring unit detects that the battery microprocessor writes battery data to the EEPROM, the marking component updates the marked storage address, so that the latest storage address is updated in time to ensure the accuracy of data writing and reading.

Figure 3:
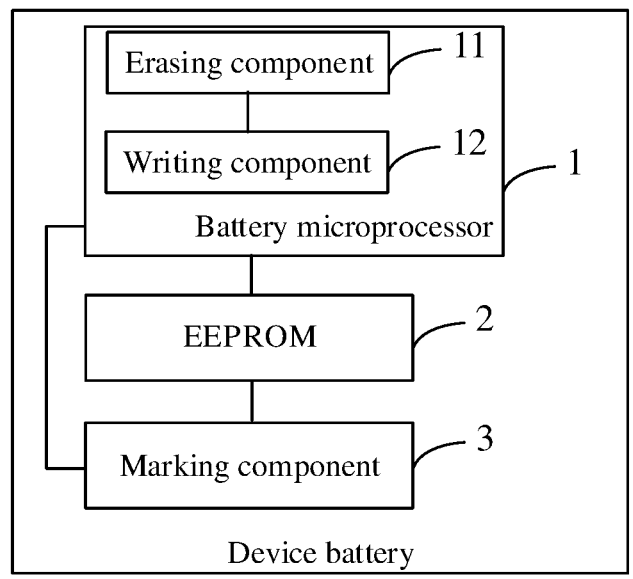
FIG. 3 is a schematic structural diagram of a device battery according to Embodiment 3 of the present application.

Optionally again, the writing method based on cyclic erasing is shown in FIG. 3. FIG. 3 is a schematic structural diagram of a device battery according to Embodiment 3 of the present application. Referring to FIG. 3, the present embodiment provides a device battery configured to write battery data in a cyclic erasing writing mode. Based on any of the other embodiments, the battery microprocessor 1 includes: an erasing component 11 and a writing component 12.

The erasing component 11 is connected to the electrically erasable programmable read-only memory 2, and the writing component 12 is connected to the erasing component 11 and the electrically erasable programmable read-only memory 2.

The erasing component 11 is configured to erase, after the battery microprocessor 1 determines a storage address for writing this time, the battery data stored in the storage address.

The writing component 12 is configured to, after the erasing component 11 finishes erasing, write, to the storage address for writing this time, battery data to be written this time.

Specifically, when the battery microprocessor 1 needs to write the battery data to the EEPROM 2, the storage address for writing this time is determined according to the storage address for writing last time and marked by the marking component 3. In practical application, the storage address in the EEPROM 2 is initially empty, that is, a storage unit corresponding to the storage address stores no data. Therefore, in the first write cycle to EEPROM 2, the determined storage address to be used for writing this time is empty. In this case, data can be written directly to the storage address without data erasure, and specifically, the data is stored in the storage unit corresponding to the storage address. Subsequently, after all the storage addresses of the EEPROM 2 are used for writing, first cyclic writing is finished, and the storage address for writing first time in all storage addresses is used for writing again. Correspondingly, in this scenario, after the storage address to be used for writing this time is determined, it may be detected that the storage address stores data. Correspondingly, the erasing component 11 of the battery microprocessor 1 erases the data currently stored in the storage address, and then the writing component 12 writes, into the storage address, the battery data to be written this time, thereby realizing cyclic erasing of the written battery data.

In the device battery provided in the present embodiment, the battery microprocessor includes the erasing component for erasing the data in the storage address for writing this time and a writing component for writing data to the storage address, so that the battery microprocessor writes data to the EEPROM by means of cyclic erasing.

Figure 4:
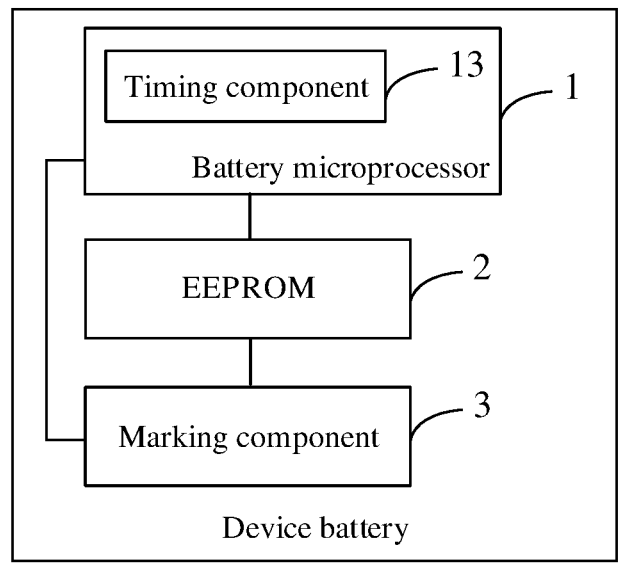
FIG. 4 is a schematic structural diagram of a device battery according to Embodiment 4 of the present application.

There are many trigger scenarios for data writing. For example, the writing may be triggered by a user irregularly, or writing may be automatically performed. Optionally, as shown in FIG. 4, FIG. 4 is a schematic structural diagram of a device battery according to Embodiment 4 of the present application. Referring to FIG. 4, the present embodiment provides a device battery configured to write battery data periodically. Based on any of the other embodiments, the battery microprocessor 1 includes: a timing component 13.

The battery microprocessor 1 is further configured to set a period for the timing component 13.

The timing component 13 is configured to periodically trigger, according to the period, the battery microprocessor 1 to write the battery data to the electrically erasable programmable read-only memory 2 in a cyclic erasing writing mode according to the storage address currently marked by the marking component 3.

Specifically, in the present embodiment, the timing component 13 is disposed. Optionally, the user may send the period to the battery microprocessor 1 through an interactive interface, and the battery microprocessor 1 sets the corresponding period for the timing component 13 according to a user instruction. Subsequently, the timing component 13 may periodically trigger the battery microprocessor 1 to write battery data to the EEPROM 2 according to the set period.

In another implementation, the writing of battery data may further be triggered according to the security state of the battery. For example, when a battery safety event occurs, writing of the battery data is performed. The battery safety events include, but are not limited to, discharging under-temperature protection, charging under-temperature protection, battery overdischarge, battery overcharge, battery discharge over-temperature, battery charge over-temperature, battery discharge short circuit, battery charge short circuit, and the like.

In the device battery provided in the present embodiment, the battery microprocessor includes a timing component for periodically triggering data writing, thereby implementing periodic writing of data to the EEPROM, ensuring the amount of data for subsequent data analysis, to implement data update.

In practical application, the EEPROM may include: a plurality of storage addresses with logical sequence relationships and a plurality of storage units, where each of the storage addresses corresponds to at least one storage unit. Specifically, the writing of data to the storage address in the solution specifically means storing, into the storage unit corresponding to the storage address, the data that needs to be written.

In addition, the number of storage units corresponding to each storage address may be determined according to battery data. For example, the battery data may include, but be not limited to data that reflects the safety status of the battery, for example, discharging under-temperature protection data, charging under-temperature protection data, battery overdischarge data, battery overcharge data, battery discharge over-temperature data, battery charge over-temperature data, battery discharge short circuit data, battery charge short circuit data, and the like. Different assignments of the data are used to indicate whether these battery safety states occur. For example, when the discharge under-temperature protection data is 1, it indicates that the discharge under-temperature protection occurs, and if the data is 0, it indicates that the discharge under-temperature protection does not occur.

The logical sequence refers to the logic of sequential cycles. Specifically, the solution adopts the data writing method of cyclic writing. In other words, there is sequential logic between each storage address, and there is an adjacent logical relationship between a first written storage address and a last written storage address, that is, a similar end-to-end ring logical structure. It may be understood that, based on the logical structure, for the storage address for writing last time, the storage address for writing first time is a storage address next to the storage address.

In practical applications, each of the storage addresses may be continuous. Correspondingly, the cyclic order and direction in the cyclic erasing may be determined according to the storage address itself, or each of the storage addresses may also be discontinuous. Correspondingly, the cyclic order and direction in the cyclic erasing may be determined by setting a cyclic ordinal corresponding to each of the storage addresses, and marking of the storage addresses may also be achieved by marking the cyclic ordinal. For example, for continuous storage addresses 0x0-0x3, the cycle direction is 0x0→0x1→0x2→0x3→0x0→0x1→ . . . . In another example, cyclic ordinals may be set for discontinuous storage addresses 0x0, 0x2 and 0x6. Assuming that the cyclic ordinal of 0x0 is 1, the cyclic ordinal of 0x2 is 3, and the cyclic ordinal of 0x6 is 2, then the cyclic ordinal determined based on the cyclic direction is 1→2→3→1→2→ . . . , and correspondingly, the cycle situation corresponding to the storage address is 0x0→0x6→0x2→0x0→0x6→ . . . .

Figure 5:
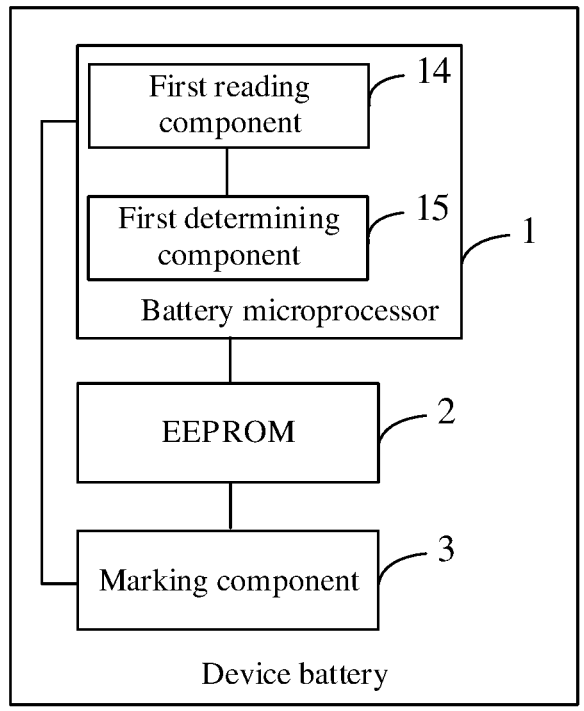
FIG. 5 is a schematic structural diagram of a device battery according to Embodiment 5 of the present application.

Based on the above implementation, in order to determine the storage address for writing this time, optionally, as shown in FIG. 5, FIG. 5 is a schematic structural diagram of a device battery according to Embodiment 5 of the present application. Referring to FIG. 5, the present embodiment provides a device battery configured to write battery data by adopting a cyclic erasing mode. Based on any of the other embodiments, the battery microprocessor 1 includes: a first reading component 14 and a first determining component 15.

The first reading component 14 is connected to the marking component 3, and the first determining component 15 is connected to the first reading component 14.

The first reading component 14 is configured to read, when battery data needs to be written, a storage address currently marked by the marking component 3.

The first determining component 15 is configured to determine, as a storage address for writing this time, a storage address next to the storage address read by the first reading component 14.

Specifically, when the battery data needs to be written, the first reading component 14 of the battery microprocessor 1 reads the storage address currently marked by the marking component 3. The storage address is a storage address for writing last time. Based on the cyclic erasing writing mode, the storage address for writing first time needs to be used as the storage address for writing this time. In combination with the foregoing memory structure, the first determining component 15 determines, as the storage address for writing this time, the address (that is, the storage address for writing first time) next to the storage address (that is, the storage address for writing last time) read by the first reading component 14.

In the device battery provided in the present embodiment, the battery microprocessor includes the first reading component for reading the storage address marked by the marking component and the first determining component for determining the storage address for writing this time according to the address read by the first reading component, so that the battery microprocessor can write data into the EEPROM according to the determined storage address for writing this time, which facilitates subsequent battery fault analysis.

In order to simplify the processing flow and improve the efficiency of data processing, optionally, the plurality of storage addresses may be continuous storage addresses. Specifically, the logical sequence between the storage addresses may also be determined according to the continuous storage addresses.

Figure 6:
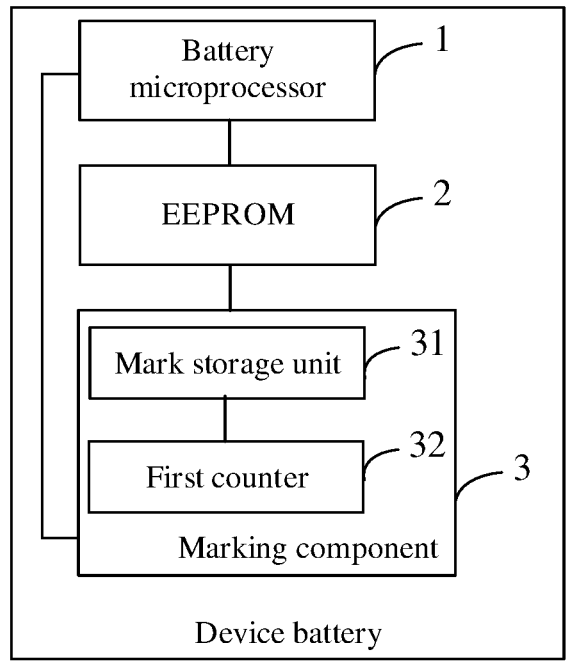
FIG. 6 is a schematic structural diagram of a device battery according to Embodiment 6 of the present application.

Based on the continuous storage addresses, in order to update the marked storage address, optionally, as shown in FIG. 6, FIG. 6 is a schematic structural diagram of a device battery according to Embodiment 6 of the present application. Referring to FIG. 6, based on any of the other embodiments, the marking component 3 includes a mark storage unit 32 and a first counter 33.

The mark storage unit 32 is connected to the first counter 33.

The mark storage unit 32 is configured to store a storage address to which battery data is written last time.

The first counter 33 is configured to, when a battery data writing event occurs, read and calculate a calculation result obtained by adding 1 to the storage address currently stored in the mark storage unit 32, and replace the storage address stored in the mark storage unit with the calculation result.

In practical application, the marking component 3 can mark the storage address in many ways. For example, marking may be performed by storing the storage address or by adding a preset identifier to the storage address. In the present implementation, marking is performed in a storing manner.

Specifically, the mark storage unit 32 of the marking component 3 is configured to store the storage address to be marked. When a battery data writing event occurs, the first counter 33 reads the storage address currently stored in the mark storage unit 32, and the storage address is the storage address for writing last time. Based on the writing method by cyclic erasing, the storage address (that is, an address next to the storage address for writing last time) for writing this time needs to be marked. In combination with the characteristic that the storage addresses are continuous, the first counter 33 calculates a calculation result obtained by adding 1 to the storage address currently stored in the mark storage unit 32, that is, the storage address for writing this time, and replaces the storage address stored in the mark storage unit 32 with the calculation result, thereby implementing the update of the storage address for writing lately.

In the device battery provided in the present embodiment, the storage addresses are continuous addresses, and the marking component includes the mark storage unit for storing a to-be-marked address and the first counter for updating the marked address, thereby implementing the update and marking of the storage address for writing last time, to ensure the accuracy of data writing and reading.

Figure 7:
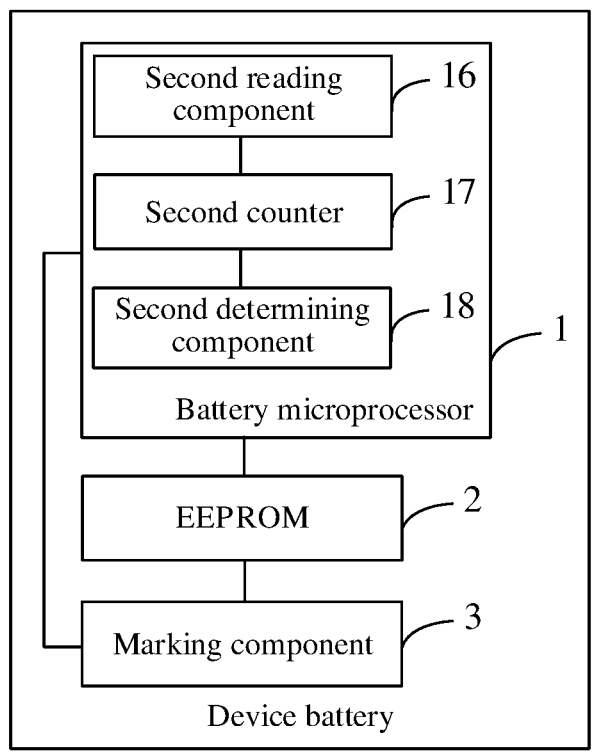
FIG. 7 is a schematic structural diagram of a device battery according to Embodiment 7 of the present application.

Similarly, based on the continuous storage addresses, in order to determine the storage address for writing this time, optionally, as shown in FIG. 7, FIG. 7 is a schematic structural diagram of a device battery according to Embodiment 7 of the present application. Referring to FIG. 7, based on any of the other embodiments, the battery microprocessor 1 includes: a second reading component 16, a second counter 17 and a second determining component 18.

The second reading component 16 is connected to the marking component 3, the second counter 17 is connected to the second reading component 16, and the second determining component 18 is connected to the second counter 17.

The second reading component 16 is configured to read, when battery data needs to be written, a storage address currently marked by the marking component 3.

The second counter 17 is configured to calculate a calculation result obtained by adding 1 to the storage address read by the second reading component 16.

The second determining component 18 is configured to determine, as a storage address for writing this time, the calculation result calculated by the second counter 17.

Specifically, when the battery data needs to be written, the second reading component 16 of the battery microprocessor 1 reads the storage address currently marked by the marking component 3. The storage address is a storage address for writing last time. Based on the writing method by cyclic erasing, the storage address for writing first time needs to be used as the storage address for writing this time. In combination with a fact that the storage addresses are continuous addresses, the second counter 17 calculates a calculation result obtained by adding 1 to the storage address currently stored in the marking component 3, that is, the storage address for writing this time, and the second determining component 18 determines, as the storage address for writing this time, the calculation result calculated by the second counter 17.

In the device battery provided in the present embodiment, the storage addresses are continuous addresses. The battery microprocessor includes the second reading component for reading the marked storage address, the second counter for calculating the calculation result obtained by adding 1 to the marked storage address, and the second determining component for determining the storage address for writing this time according to the calculation result, so that the battery microprocessor can write data into the EEPROM according to the determined storage address for writing this time, which facilitates subsequent battery fault analysis.

It should be noted that the "first" and "second" in the solution are only used for distinguishing, and the setting and connecting methods are not limited. In actual application, structures in the embodiments of the present invention may be integrated into one module, or the structures may exist alone physically, or two or more structures may be integrated into one module.

In order to better understand the solution, description is given by using examples in the following table.

Further in combination with the solution, the storage address for recording (writing) last time is marked. For example, assuming that the storage address 7 in the above table is the storage address for writing last time, the battery data written this time indicates that discharge of the battery occurs, and the CUV is set to 1, indicating that overdischarge protection of the battery occurs. For example, the storage address for writing last time is 6, the battery data written this time indicates that charge of the battery occurs, and the OTC is set to 1, indicating that charge overtemperature protection of the battery occurs. In addition, the storage address for writing first time is 8. If new battery data needs to be written, the battery microprocessor will erase the data stored in the storage address 8, then write the battery data to the storage address 8, and mark the storage address for writing last time as the storage address 8.

In combination with the above table, when the battery data in the EEPROM is read, the battery microprocessor may read the data records last 16 times in turn according to the marked storage address and the writing time, that is, read the battery data in the storage addresses 8, 9, 10, . . . , 16, 1, 2, . . . 7 in turn.

It may be understood that the above example is merely an example and does not constitute a limitation. For example, the battery data in practical application may further include other data, and is not limited to CUV, COV, and the like mentioned above. In addition, the number of times that the recorded data is retained is not limited to 16 times in the above example, and the numeral system and format of the written data may not be limited.

| Cycle | STA | UTD | UTC | CUV | COV | OTD | OTC | ASCD | ASCC |
|-------|-----|-----|-----|-----|-----|-----|-----|------|------|
| 1     | 0   | 0   | 0   | 0   | 0   | 0   | 0   | 0    | 0    |
| 2     | 1   | 0   | 0   | 0   | 0   | 0   | 0   | 0    | 0    |
| 3     | 0   | 0   | 0   | 0   | 0   | 0   | 0   | 0    | 0    |
| 4     | 1   | 0   | 0   | 0   | 0   | 0   | 1   | 0    | 0    |
| 5     | 0   | 0   | 0   | 0   | 0   | 0   | 0   | 0    | 0    |
| 6     | 1   | 0   | 0   | 0   | 0   | 0   | 1   | 0    | 0    |
| 7     | 0   | 0   | 0   | 1   | 0   | 0   | 0   | 0    | 0    |
| 8     | 1   | 0   | 0   | 0   | 0   | 0   | 0   | 0    | 0    |
| 9     | 0   | 0   | 0   | 0   | 0   | 0   | 0   | 1    | 0    |
| 10    | 1   | 0   | 0   | 0   | 0   | 0   | 0   | 0    | 0    |
| 11    | 1   | 0   | 0   | 0   | 0   | 0   | 0   | 0    | 0    |
| 12    | 0   | 0   | 0   | 0   | 0   | 0   | 0   | 0    | 0    |
| 13    | 1   | 0   | 0   | 0   | 1   | 0   | 0   | 0    | 0    |
| 14    | 0   | 0   | 0   | 0   | 0   | 0   | 0   | 0    | 0    |
| 15    | 1   | 0   | 0   | 0   | 0   | 0   | 0   | 0    | 0    |
| 16    | 1   | 0   | 0   | 0   | 0   | 0   | 0   | 0    | 0    |

As shown in the above table, assuming that the first column (Cycle) in the table is the storage address, a number of storage addresses in this example is 16, and these 16 storage addresses are continuous. In addition, Cycle represents the cycle order (for example, 1→2→ →16→1→ 2→ . . . ) for data recording. Correspondingly, based on the solution, the table stores battery data last 16 times. UTD indicates discharge under-temperature protection, UTC indicates charge under-temperature protection, CUV indicates battery over-discharge, COV indicates battery overcharge, OTD indicates battery discharge over-temperature, OTC indicates battery charge over-temperature, ASCD indicates battery discharge short circuit, and ASCC indicates battery charge short circuit. 0 indicates no occurrence, and 1 indicates occurrence. In STA (charge and discharge states), for example, 1 under the STA indicates that the battery is in a charged state, and 0 indicates that the battery is in a discharged state.

An embodiment of the present application further provides an unmanned aerial vehicle (UAV), including the device battery according to any of the embodiments.

In combination with the application scenario of the UAV, in the solution, the problem of insufficient memory of the battery microprocessor of the UAV can be skillfully solved by adding an independent EEPROM, and due to an independent memory, storage memory can be selected according to the actual use situation, and the storage memory is maximized with lower device costs, to increase the flexibility of design. In addition, the independent storage device has more stable performance and safer data storage than the memory inside the microprocessor.

A person of ordinary skill in the art may understand that all or some of the steps of the embodiments may be implemented by a computer program instructing relevant hardware. The computer program may be stored in a computer-readable storage medium.

Finally, it should be noted that the foregoing embodiments are merely used for describing the technical solutions of the present application, but are not intended to limit the present application. Although the present application is described in detail with reference to the foregoing embodiments, it should be appreciated by a person of ordinary skill in the art that, modifications may still be made to the technical solutions recorded in the foregoing embodiments, or equivalent replacements may be made to the part of all of the technical features; and these modifications or replacements will not cause the essence of corresponding technical solutions to depart from the scope of the technical solutions in the embodiments of the present application.

What is claimed is:

1. A device battery, comprising: a battery controlling microprocessor, an electrically erasable programmable read-only memory and a storing component,
   the battery controlling microprocessor being connected to the electrically erasable programmable read-only memory, and the storing component being connected to the battery controlling microprocessor and the electrically erasable programmable read-only memory;
   the storing component being configured to store a storage address to which battery data is written last time; and
   the battery controlling microprocessor being configured to write battery data to the electrically erasable programmable read-only memory in a cyclic erasing writing mode according to a storage address currently stored by the storing component;
   wherein the storing component comprises: a monitoring unit,
   the monitoring unit being connected to the battery controlling microprocessor;
   the monitoring unit being configured to monitor whether a battery data writing event occurs; and
   the storing component being specifically configured to, when the monitoring unit detects the occurrence of the battery data writing event, clear the currently stored storage address and store a storage address for writing this time.

2. The device battery according to claim 1, wherein the battery controlling microprocessor comprises: an erasing component and a writing component,
   the erasing component being connected to the electrically erasable programmable read-only memory, and the writing component being connected to the erasing component and the electrically erasable programmable read-only memory;
   the erasing component being configured to erase, after the battery controlling microprocessor determines a storage address for writing this time, the battery data stored in the storage address; and
   the writing component being configured to, after the erasing component finishes erasing, write, to the storage address for writing this time, battery data that needs to be written this time.

3. The device battery according to claim 1, wherein the battery controlling microprocessor comprises: a timing component,
   the battery controlling microprocessor being further configured to set a period for the timing component; and
   the timing component being configured to periodically trigger, according to the period, the battery controlling microprocessor to write the battery data to the electrically erasable programmable read-only memory in the cyclic erasing writing mode according to the storage address currently stored by the storing component.

4. The device battery according to claim 1, wherein the electrically erasable programmable read-only memory comprises: a plurality of storage addresses with logical sequence relationships and a plurality of storage units, wherein each of the storage addresses corresponds to at least one storage unit.

5. The device battery according to claim 4, wherein the battery controlling microprocessor comprises: a first reading component and a first determining component, wherein
   the first reading component is connected to the storing component, and the first determining component is connected to the first reading component;
   the first reading component is configured to read, when battery data needs to be written, the storage address currently stored by the storing component; and
   the first determining component is configured to determine, as a storage address for writing this time, a storage address next to the storage address read by the first reading component.

6. The device battery according to claim 4, wherein the plurality of storage addresses are continuous.

7. The device battery according to claim 6, wherein the storing component comprises: an another storage unit and a first counter,
   the another storage unit being connected to the first counter;
   the another storage unit being configured to store the storage address to which battery data is written last time; and
   the first counter being configured to, when a battery data writing event occurs, read and calculate a calculation result obtained by adding 1 to the storage address currently stored in the another storage unit, and replace the storage address stored in the another storage unit with the calculation result.

8. The device battery according to claim 6, wherein the battery controlling microprocessor comprises: a second reading component, a second counter and a second determining component, wherein
   the second reading component is connected to the storing component, the second counter is connected to the second reading component, and the second determining component is connected to the second counter;
   the second reading component is configured to read, when battery data needs to be written, the storage address currently stored by the storing component;
   the second counter is configured to calculate a calculation result obtained by adding 1 to the storage address read by the second reading component; and
   the second determining component is configured to determine, as a storage address for writing this time, the calculation result calculated by the second counter.

9. The device battery according to claim 1, wherein the storing component is integrated inside the electrically erasable programmable read-only memory.

10. An unmanned aerial vehicle (UAV), comprising: the device battery according to claim 1.

* * * * *